United States Patent
Arndt (10) Patent No.: US 9,200,371 B2
(45) Date of Patent: Dec. 1, 2015

(54) NANO-LAYER COATING FOR HIGH PERFORMANCE TOOLS

(75) Inventor: Mirjam Arndt, Bad Ragaz (CH)

(73) Assignee: OERLIKON SURFACE SOLUTIONS AG, TRUBBACH, Trubbach (CH)

( * ) Notice: Subject to any disclaimer, the term of this patent is extended or adjusted under 35 U.S.C. 154(b) by 12 days.

(21) Appl. No.: 14/130,076

(22) PCT Filed: Jun. 25, 2012

(86) PCT No.: PCT/EP2012/002673
§ 371 (c)(1),
(2), (4) Date: Feb. 4, 2014

(87) PCT Pub. No.: WO2013/000557
PCT Pub. Date: Jan. 3, 2013

(65) Prior Publication Data
US 2014/0147683 A1 May 29, 2014

Related U.S. Application Data

(60) Provisional application No. 61/503,038, filed on Jun. 30, 2011.

(51) Int. Cl.
*C23C 14/06* (2006.01)
*C23C 28/04* (2006.01)
*C23C 14/32* (2006.01)
*C23C 28/00* (2006.01)
*C23C 30/00* (2006.01)
(Continued)

(52) U.S. Cl.
CPC ........... *C23C 28/044* (2013.01); *C23C 14/0641* (2013.01); *C23C 14/16* (2013.01); *C23C 14/325* (2013.01); *C23C 28/048* (2013.01); *C23C 28/42* (2013.01); *C23C 28/44* (2013.01); *C23C 30/005* (2013.01); *B82Y 30/00* (2013.01)

(58) Field of Classification Search
USPC ................... 51/307, 309; 428/697, 698, 699; 204/192.15, 192.16, 298.1, 298.2, 204/298.41
See application file for complete search history.

(56) References Cited

U.S. PATENT DOCUMENTS 5,580,653 A * 12/1996 Tanaka et al. ................... 51/309
6,586,122 B2 7/2003 Ishikawa
(Continued)

FOREIGN PATENT DOCUMENTS

| JP | 2000-326107 | * 11/2000 |
| JP | 2000-334606 | * 12/2000 |

(Continued)

OTHER PUBLICATIONS

International Preliminary Report on Patentability and Written Opinion issued for Application No. PCT/EP2012/002673 dated Jan. 7, 2014.

(Continued)

*Primary Examiner* — Archene Turner
(74) *Attorney, Agent, or Firm* — Pearne & Gordon LLP (57) ABSTRACT

The present invention relates to a coated body comprising a substrate and a coating onto the substrate, the coating having a nanolaminated coating system having a nanolaminated coating structure of alternating A and B layers (AlxTi1-x-yWy)N/(Ti1-z-uSizWu)N, the individual thickness of each nanolayer being maximal 200 nm and the nanolaminated coating structure exhibiting a fine-grained structure.

16 Claims, 6 Drawing Sheets

(51) Int. Cl.
*C23C 14/16* (2006.01)
*B82Y 30/00* (2011.01)

(56) References Cited

U.S. PATENT DOCUMENTS

| | | | | |
|---|---|---|---|---|
| 7,060,345 B2* | 6/2006 | Fukui et al. | ............... | 428/699 |
| 8,409,695 B2* | 4/2013 | Ni et al. | ............... | 428/697 |
| 8,852,305 B2* | 10/2014 | Andersson et al. | ............... | 51/307 |
| 8,864,861 B2* | 10/2014 | Andersson et al. | ............... | 51/307 |
| 2011/0308941 A1* | 12/2011 | Krassnitzer et al. | ..... | 204/298.41 |
| 2013/0071617 A1* | 3/2013 | Sjolen et al. | ............... | 428/216 |
| 2013/0126347 A1* | 5/2013 | Krassnitzer et al. | ..... | 204/298.16 |

FOREIGN PATENT DOCUMENTS

| | | | |
|---|---|---|---|
| JP | 2000-334607 | * | 12/2000 |
| JP | 2003-089004 | * | 3/2003 |
| WO | 2010/088947 A1 | | 8/2010 |
| WO | 2010/140958 A1 | | 12/2010 |
| WO | 2011/131756 A1 | | 10/2011 |
| WO | 2011/160766 A1 | | 12/2011 |

OTHER PUBLICATIONS

Chi-Lung Chang et al. "Characteristics and performance of TiSiN/TiAlN multilayers coating synthesized by cathodic arc plasma evaporation" Surface & Coating Technology. vol. 202 No. 4-7 dated Nov. 13, 2007.

International Search Report issued in Application No. PCT/EP2012/002673 dated Nov. 27, 2012.

* cited by examiner

NANO-LAYER COATING FOR HIGH PERFORMANCE TOOLS

The present invention relates to a hard nano-layered coating system or nanolaminated coating structure and a method to deposit it on a substrate surface. More specifically, the nano-layered coating system according to the present invention relates to a coating system which includes nano-layers of type A and nano-layers of type B. The nano-layers of type A containing aluminum, Al, titanium, Ti, and nitrogen, N, and the nano-layers of type B containing titanium, Ti, silicon, Si, and nitrogen, N. Furthermore, according to the present invention, preferably at least some of the nano-layers of type A and/or nano-layers of type B include also tungsten, W.

The concepts "nano-layered coating system", "nanolaminated coating structure", "nanolaminated structure" and "nano-layered structure" are used undifferentiated in the context of the present invention and have the same meaning.

The coating system and deposition method according to the present invention are especially suitable for manufacture of high performance solid carbide drills, which allow a higher productivity in automotive applications such as steel and cast iron machining compared to the state of the art.

STATE OF THE ART

Cutting tools are usually coated using PVD (physical vapor deposition) and/or CVD (chemical vapor deposition) methods in order to attain better efficiency by cutting operations. PVD and CVD coatings for cutting tools are mostly designed in order to provide enhanced wear resistance and oxidation resistance, however for attaining higher efficiency the coating design must be adapted for each particular application regarding the most convenient combination of coating properties. Because of that many different types of PVD (physical vapor deposition) and CVD (chemical vapor deposition) coatings have been so far developed.

In U.S. Pat. No. 5,580,653 it is proposed a hard coating having a composition given by the following formula $(Al_x Ti_{1-x-y}Si_y)(C_{1-z}N_z)$ where $0.05 \leq x \leq 0.75$, $0.01 \leq y \leq 0.1$, and $0.6 \leq z \leq 1$. It was indicated that if x is less than 0.05, or y is less than 0.01, then it is impossible to realize to a sufficient extent the improvement in the oxidation resistance properties. Further it was indicated that if x exceeds 0.75 or y exceeds 0.1, the crystal structure of the coating changes from a cubic structure to a hexagonal structure, with a consequent decrease in the hardness and wear resistance properties. For the coating deposition were used physical vapor deposition methods, more specifically arc discharge ion plating processes, in which alloyed targets having the same metal composition as the desired metal composition in coating were used as material source.

In U.S. Pat. No. 6,586,122 it was mentioned however that the mere addition of Si to conventional TiAlN coating films can improve oxidation resistance at most less than 1.2 times, which is insufficient to meet the present demands of the high-speed cutting market. Further in U.S. Pat. No. 6,586,122 it was explained that though the addition of Si to a Ti-based hard coating film can slightly improve its oxidation resistance, it cannot improve sufficiently the static wear resistance of the original coating film and therefore it results in an insufficient improvement. Additional it was mentioned that coatings films simply containing Si are more brittle by remarkably large compressive stress than a coating film doesn't contain Si, and this excessive compressive stress makes the coating film prone to peel off from the cutting tool substrate quickly.

Therefore the authors of U.S. Pat. No. 6,586,122 propose a Si-containing multilayer-coated cutting tool that can exhibit sufficient cutting performance, particularly excellent oxidation resistance and wear resistance, which comprises a cutting tool substrate, and a multilayer coating film, said multilayer coating film comprising a first hard coating film formed on said substrate that doesn't contain Si and a second hard coating film containing Si. The first hard coating film comprises one or more metallic elements selected from the group consisting of Ti, Al and Cr, and one or more non-metallic elements selected from the group consisting of N, B, C and O); while the second hard coating film comprises Si and one or more metallic elements selected from the group consisting of Groups 4a, 5a and 6a of the periodic table and Al, and one or more non-metallic elements selected from the group consisting of N, B, C and O. In order to enhance sufficiently the cutting performance of the cutting tool the second hard coating film must be a composition-segregated polycrystalline film comprising a phase having a relatively high Si concentration and a phase having a relatively low Si concentration. This second hard coating film must be deposited in such a manner that it features an amorphous or microcrystalline structure in which Si-rich, hard crystal grains (having an average grain size of preferably not more than 50 nm) are dispersed in a matrix constituted by a phase containing a relatively small amount of Si. Furthermore it was mentioned that such a multilayer hard coating film exhibits particularly special small compressive stress and improved wear resistance as well as improved adhesion to the cutting tool substrate because of the special structure of the second hard coating film. Moreover it was explained that such kind of Si-containing hard coating films which contains different phases with different amounts of Si cannot be formed by conventional coating methods but by coating methods which involve sequential or periodical changes of the ion energy during coating, e.g. PVD coating methods in which a substrate bias pulse voltage is applied which is sequentially or periodically changed between positive voltage and negative voltage during coating process. In this manner sequential or periodic changes of the ion energy are produced which also produce changes of the ions diffusion behavior and subsequently generate variations of the Si concentration in the Si-containing hard coating film. Besides it was indicated that also the coating temperature is an important factor for controlling the ions diffusion behavior and therefore for controlling crystal form, particularly grain size of the crystals that constitute the high Si concentration phase in the second hard coating film of the multilayer coating film.

WO2010140958 discloses a cutting tool for machining by chip removal comprising a body of a hard alloy of cemented carbide, cermet, ceramics, cubic boron nitride based material or high speed steel, onto which is deposited a hard and wear resistant PVD coating characterized in that said coating comprises a columnar and polycrystalline nanolaminated structure of alternating A and B layers where layer A is (Ti1-xAlxMe1p)Na, with $0.3<x<0.95$, preferably $0.45<x<0.75$, $0.90<a<1.10$, preferably $0.96<a<1.04$, $0 \leq p<0.15$, and Me1 is one or more of Zr, Y, V, Nb, Mo and W, and where layer B is (Ti1-y-zSiyMe2z)Nb, with $0.05<y<0.25$, preferably $0.05<y<0.18$, $0 \leq z$ 0.4, $0.9<b<1.1$, preferably $0.96$ $b<1.04$, and Me2 is one or more of Y, V, Nb, Mo, W and Al, with a thickness of the nanolaminated structure between 0.5 and 20 µm, preferably between 0.5 and 10 µm, an average column width between 20 and 1000 nm, and an average individual thickness of A and B layers between 1 and 50 nm.

OBJECTIVE OF THE PRESENT INVENTION

It is an objective of the present invention to provide a coating system for high performance cutting tools, in particular a broadband coating for high performance solid carbide drills which allows higher productivity compared to the state of the art, particularly in automotive applications such as steel and cast iron machining. Furthermore it is an objective of the present invention to provide an industrial-suited coating method for manufacturing the aforesaid high performance coated tools. Additionally the coating method according to the present invention should be as robust and uncomplicated as possible.

DESCRIPTION OF THE INVENTION

The aforementioned objective is achieved by the present invention by providing a hard nano-layered coating system and a coating deposition method thereof both of them especially designed for improving efficiency of high performance cutting tools.

In order to better explain the present invention the FIGS. 1 to 8 will be used for the description.

The hard nano-layered coating system (5) according to the present invention relates to a multilayer coating system which includes nano-layers of type A and nano-layers of type B deposited alternately one on each other. The nano-layers of type A containing aluminum, Al, titanium, Ti, and nitrogen, N, and the nano-layers of type B containing titanium, Ti, silicon, Si, and nitrogen, N. Preferentially, at least some nano-layers of type A and/or at least some nano-layers of type B including additionally tungsten, W.

Each nano-layer of type A or B included in the hard nano-layered coating system according to the present invention having fundamentally a maximal individual layer thickness less than 200 nm.

Within the present invention a nano-bilayer period will be defined as the sum of the thickness of two nano-layers, respectively one nano-layer of type A and one nano-layer of type B, which are deposited one of each repeatedly (at least two times).

It was determined that coatings systems as described above but having nano-bilayer period of about 300 nm or more exhibit a markedly inferior cutting performance.

Hence a preferred embodiment of the hard nano-layered coating system according to the present invention is characterized by having essentially nano-bilayer periods less than 300 nm.

Further a preferred embodiment of the hard nano-layered coating system according to the present invention comprises nano-layers of type A and B having element composition according to the following formulas:

Nano-layer A: $(Al_xTi_{1-x-y}W_y)N$ with x and y in at. % and where $0.50 \leq x \leq 0.65$ and $0 \leq y \leq 0.10$ Nano-layer B: $(Ti_{1-z-u}Si_zW_u)N$ with z and u in at. % and where $0.05 \leq z \leq 0.30$ and $0 \leq u \leq 0.10$ Further a preferred embodiment of the hard nano-layered coating system according to the present invention comprises at least four or preferably at least ten individual nano-layers, respectively at least two nano-layers of type A and two nano-layers of type B or preferably at least five nano-layers of type A and five nano-layers of type B, where the nano-layers of type A and the nano-layer of type B are deposited alternately, i.e. each one nano-layer of type A deposited on each corresponding one nano-layer of type B and/or each one nano-layer of type B deposited on each corresponding one nano-layer of type A.

Figure 1:
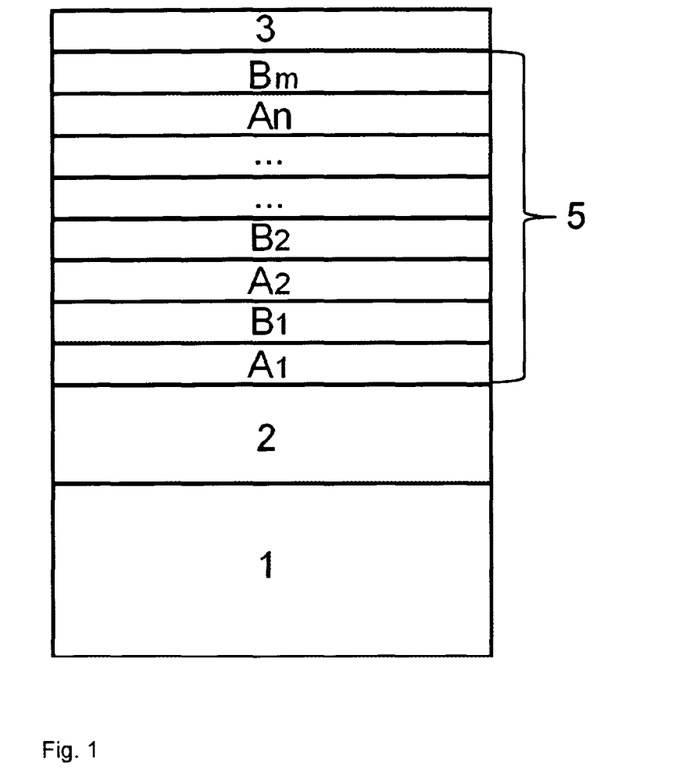
FIG. 1: Draft of the coating architecture according to the present invention

A hard nano-layered coating system (5) according to the present invention is drawn in FIG. 1. The hard nano-layered coating system in FIG. 1 comprises a quantity n of nano-layers of type A, respectively $A_1, A_2, A_3, \ldots A_n$ and a quantity m of nano-layers of type B, respectively $B_1, B_2, B_3, \ldots B_m$, the thickness of the nano-layers of type A is denoted as dA, respectively $dA_1, dA_2, dA_3, \ldots dA_n$, and the thickness of the nano-layers of type B is denoted as dB, respectively $dB_1, dB_2, dB_3, \ldots dB_m$. According to the present invention the quantity of nano-layers of type A is preferably equal than the quantity of nano-layers of type B: n=m or at least n≅m In other preferred embodiment of the hard nano-layered coating system according to the present invention the thickness of the nano-layers of type A and the thickness of the nano-layers of type B are almost equal: dA≅dB, respectively $dA_n \cong dB_m$ and $A_1 = dA_2 = dA_3 = \ldots dA_n$ and $dB_1 = dB_2 = dB_3 = \ldots dB_m$ Particularly, a very good cutting performance was observed by coatings deposited according to the present invention when the thickness of the B layers was greater than the thickness of the A layers. Therefore, in a further preferred embodiment of the hard nano-layered coating system according to the present invention the thickness of the nano-layers of type A is smaller than the thickness of the nano-layers of type B: dA<dB or preferably dA<<dB, respectively $dA_n < dB_m$ or preferably $dA_n << dB_m$, where $dA_1 = dA_2 = dA_3 = \ldots dA_n$ and $dB_1 = dB_2 = dB_3 = \ldots dB_m$ In one more preferred embodiment of the hard nano-layered coating system according to the present invention the thickness of the nano-layers of type A is equal or smaller than the thickness of the nano-layers of type B and the thickness of the individual nano-layers A and the thickness of the individual nano-layers B vary along the total coating thickness: dA dB, respectively $dA_n \leq dB_m$, where a) $dA_1 \geq dA_2 \geq dA_3 \geq \ldots dA_n$ and $dB_1 \geq dB_2 \geq dB_3 \geq \ldots dB_m$, or b) $dA_1 \leq dA_2 \leq dA_3 \leq \ldots dA_n$ and $dB_1 \leq dB_2 \leq dB_3 \leq \ldots dB_m$, or c) At least one portion of the total coating thickness comprises nano-layers of type A and nano-layers of type B deposited according to a) and at least one portion of the total coating thickness comprises nano-layers of type A and nano-layers of type B deposited according to b)

As showed in FIG. 1 the architecture of a hard nano-layered coating system according to the present invention can include in addition an interlayer layer (2) between the substrate (1) and the hard nano-layer coating system composed of the alternated nano-layers A and nano-layers B. The thickness and composition of the interlayer (2) should be selected for example in order to influence the texture of the hard nano-layered coating system and to attain reduced stress in coating. Furthermore, a top layer (3) can also be deposited on the last layer of the nano-layer coating system composed of the alternated nano-layers A and nano-layers B as it is drawn in FIG. 1.

In one embodiment of the present invention between the substrate (1) and the hard nano-layered coating system it is deposited an interlayer (2) consisting of AlTiN or AlTiWN having the same Al and Ti or Al, Ti and W concentration ratio of it in the A nano-layers which are forming the hard nano-layer coating system.

In other embodiment of the present invention a top-layer (3) is deposited on the last layer of the nano-layer coating system composed of the alternated nano-layers A and nano-layers B in order to provide a special surface color.

Both the interlayer (2) and the top layer (3) should be deposited as thin as possible. The $(Al_xTi_{1-x-y}W_y)N/(Ti_{1-z-u}Si_zW_u)N$ coatings according to the present invention were deposited on high performance solid carbide drills using PVD techniques. More exactly the coatings were deposited by means of arc ion plating deposition methods at an Innova coating machine of the company Oerlikon Balzers. Especially suitable coating parameters for the deposition of the coatings according to the present invention were:

$N_2$-Pressure: 4-7 Pa
DC Substrate bias-voltage: −20-60 V
Temperature: 450-700° C.
Arc-current was fixed for each experiment taking into account the kind of the arc-evaporator used for the evaporation of the target material and the desired thickness of the nano-layers.

Other important aspect of the present invention is the significantly influence of the kind of arc-evaporator used for the coating deposition.

Different types of coatings were deposited according to the present invention using different types of arc-evaporators. Arc-evaporators of the type described in the patent documents WO2010088947 and US61/357,272 were found to be particularly good suitable for the deposition of the coatings according to the present invention. Using these kinds of arc-evaporators was possible to obtain coatings exhibiting lowest hexagonal phase content, not too high inherent compressive stresses and preferred texture, which results in particularly good coating properties and best cutting performance.

Using the above mentioned arc-evaporators it was possible to deposit coatings according to the present invention which exhibit an excellent combination of high rigidity, high oxidation resistance and low intrinsic compressive stress which results in an excellent cutting performance particularly for drilling operations.

Figure 2:
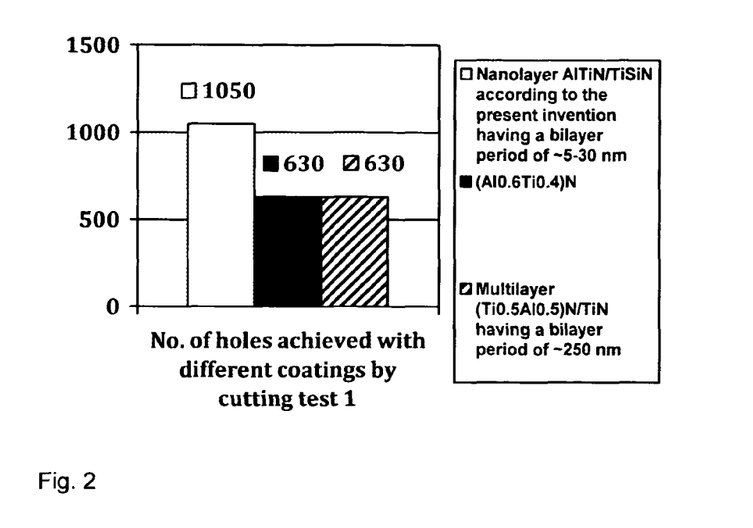
FIG. 2: Cutting Test 1
Figure 3:
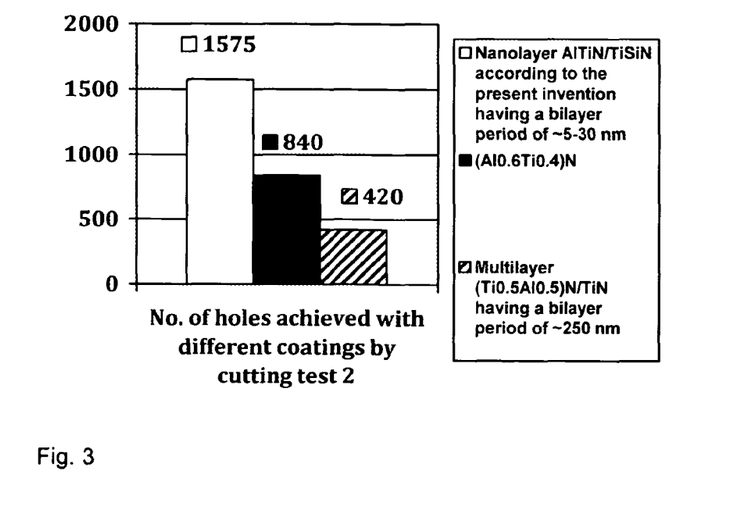
FIG. 3: Cutting Test 2
Figure 4:
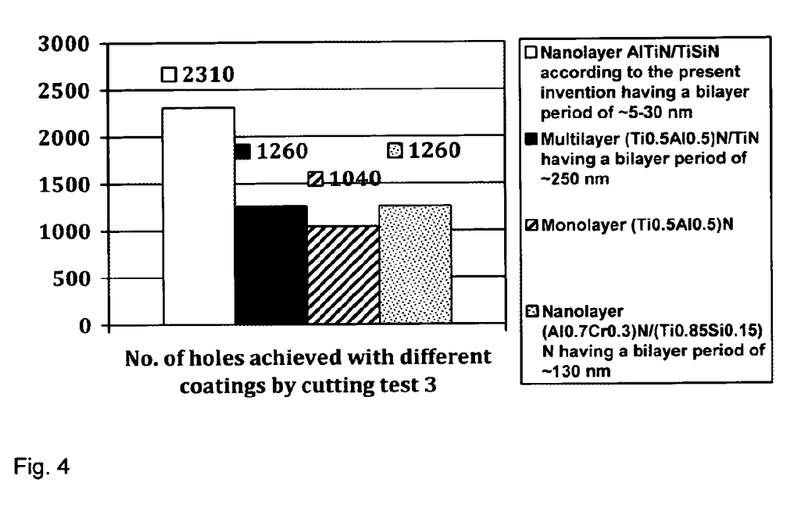
FIG. 4: Cutting Test 3

The coatings according to the present invention exhibit also superior performance by cutting tests than state of the art coatings as it is shown in FIGS. 2, 3 and 4.

Figure 5:
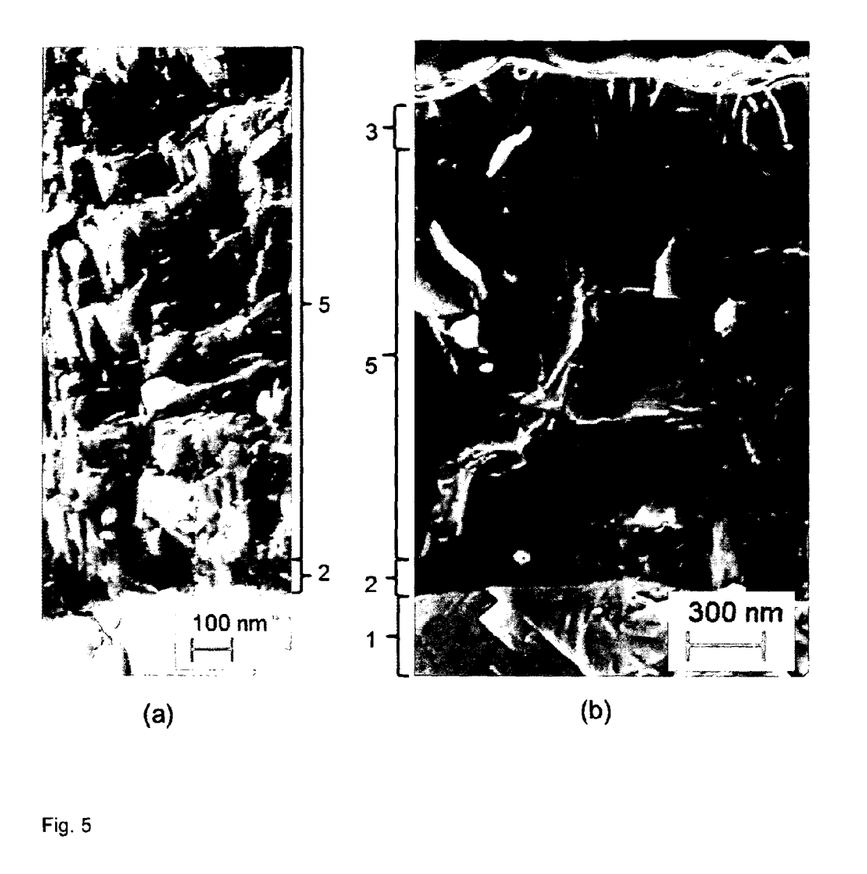
FIG. 5: Fractured cross-section scanning electron micrographs of the inventive coating, a) Nanolaminated structure deposited at 570° C., b) Nanolaminated structure deposited at 500° C.

Both of the arc evaporators or arc evaporation sources mentioned above were decisive for the deposition of the coatings according to the present invention. In each case the configuration of the arc evaporation source and the operational mode influenced the coating properties. Particularly, it was possible to influence the microstructure of the nanolaminated coatings turning it fine-grained instead of columnar obtaining in such a manner a non-columnar structure but fine-grained structure. The formation of these fine-grained structures in the nanolaminated films deposited according to the present invention can be clearly observed in FIG. 5. The pictures shown in FIG. 5 correspond to fractured cross-section scanning electron micrographs of two coatings deposited according to the present invention and comprising a nanolaminated structure (5) of alternating A and B layers, where the layers A are AlTiN layers and the layers B are TiSiN nano-layers, respectively, and having a bilayer period (the sum of the thickness of one A layer and one B layer deposited alternately one on each other at least two times i.e. at least forming a A/B/A/B or B/A/B/A structure) of approximately 50 nm or less. The nanolaminated structures shown in FIGS. 5a and 5b were deposited maintaining a substrate temperature during coating of approximately 570° C. and 500° C., respectively. Both nanolaminated structures exhibit a fine-grained structure with different grain size.

The produced nanolaminated structures exhibiting a fine-grained structure according to the present invention are in particular more advantageous for prevention of crack propagation than similar coatings exhibiting a columnar structure. It can be caused by the difference in the distribution of the grain boundary or crystal boundary in the nanolaminated structure. In a columnar structure the crystals grow as columns in parallel having consequently a long crystal boundary which extends to the substrate across the coating thickness facilitating the crack propagation along the coating thickness in direction to the substrate and consequently resulting in a faster coating delamination or coating failure. In contrast to a columnar structure, a fine-grained structure like it which is produced according to the present invention, comprises fine grains whose crystal boundary or grain boundary doesn't extend to the substrate across the coating thickness and consequently stopping the crack propagation along the coating thickness in direction to the substrate.

Possibly because of the reason explained above, the fine-grained structures exhibited by the nanolaminated structures formed according to the present invention show particularly better cutting performance during drilling and milling operations in relation to life time, fatigue resistance, crater wear resistance, fracture toughness and oxidation resistance than columnar structures.

Figure 6:
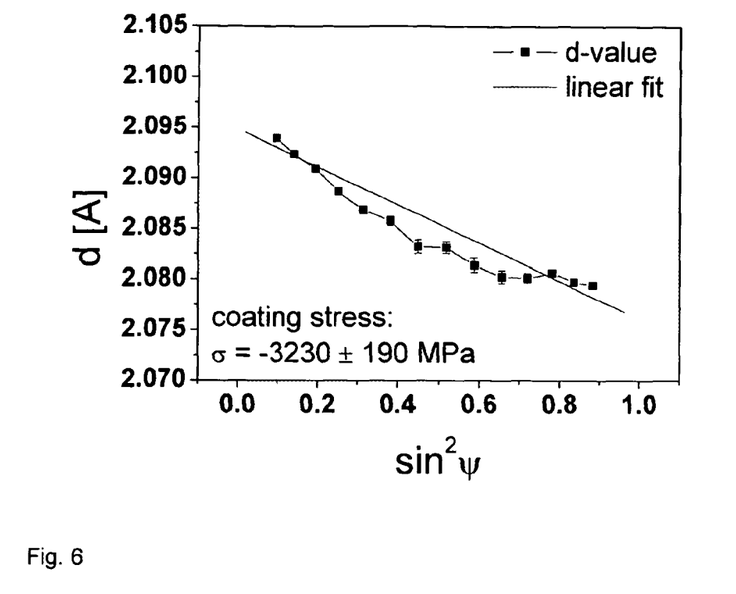
FIG. 6: Example of the measuring method for the calculation of the residual stress a in the nanolaminated structure comprised in the inventive coating 3 referred to as inventive 3 in FIG. 7.
Figure 7:
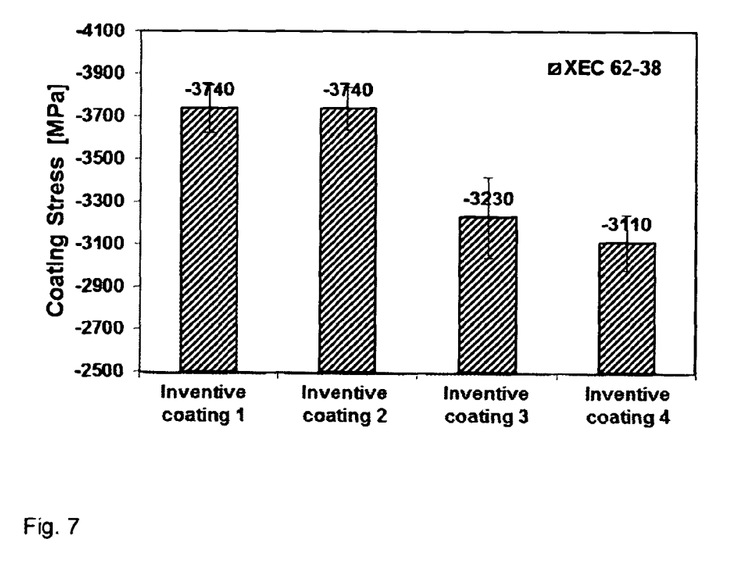
FIG. 7: Calculated residual stresses a of four different inventive coatings 1, 2, 3 and 4.

The average residual stress, σ, of the nanolaminated structure of alternating A and B nano-layers comprised in the inventive coatings deposited according to the present invention was measured and the measured values of some of the deposited inventive coatings are shown in FIG. 7. The stresses were evaluated by XRD measurements using the $\sin^2\psi$ method. The measurements were performed using CuKα-radiation of the 200 peak at about 43° 2θ. The method used for the calculation of residual stresses in the nanolaminated coating structures deposited according to the present invention is exemplary shown in FIG. 6 using the example of the inventive coating 3. The inventive coating 3 comprises a nanolaminated structure of alternating AlTiN and TiSiN nano-layers, the overall nanolaminated structure having average composition in atomic percentage of 20.3% Ti, 14.18% Al, 2.15% Si and 55.37% N, measured by energy dispersive x-ray spectroscopy. The bilayer period was less than 50 nm. The inventive coating 3 was deposited by arc PVD techniques using powder metallurgical composite TiAl-targets having a composition in atomic percentage of 60% Al/40% Ti for the deposition of the TiAlN-layers and melt metallurgical composite TiSi-targets having a composition in atomic percentage of 85% Ti/15% Si for the deposition of the TiSiN-layers.

In a preferred embodiment of a coating according to the present invention, the nanolaminated structure of alternating nano-layers A and B exhibit an average residual stress, a, between 2 and 5 GPa, preferably between 2.5 and 4 GPa, more preferably between 2.8 and 4 GPa. These recommended values of residual stress can be particularly advantageously for drilling and milling operations.

In another preferred embodiment of the present invention a nanolaminated $(Al_xTi_{1-x-y}W_y)N/(Ti_{1-z-u}Si_zW_u)N$ with $y=u°=0$ is deposited by means of arc PVD techniques using as source material AlTi-targets made by powder-metallurgical techniques and TiSi-targets made by melt-metallurgical techniques for the deposition of the $(Al_xTi_{1-x})N$ and the $(Ti_{1-z}Si_z)N$ nano-layers, respectively.

In a further preferred embodiment of the present invention a nanolaminated $(Al_xTi_{1-x-y}W_y)N/(Ti_{1-z-u}Si_zW_u)N$ with $y=u°=0$ is deposited by means of arc PVD techniques using as source material AlTi-targets made by powder-metallurgical techniques and TiSi-targets also made by powder-metallurgical techniques for the deposition of the $(Al_xTi_{1-x})N$ and the $(Ti_{1-z}Si_z)N$ nano-layers, respectively.

Example 1 of Coating Deposition According to the Present Invention:

AlTiN/TiSiN coatings having a bilayer period of about 5-30 nm were deposited on high performance solid carbide drills Ø 8.5 mm at a coating machine of the company Oerlikon Balzers of the type Innova by following coating conditions:
$N_2$-Pressure: 6 Pa
Substrate bias-voltage: −40 V (DC)
Temperature: 570° C.

Targets having an element composition of $Al_{0.6}Ti_{0.4}$ and $Ti_{0.85}Si_{0.15}$ were used respectively for the deposition of the AlTiN and TiSiN nano-layer. The material source targets were evaporated using arc evaporators of the type proposed by Krassnitzer et al. in patent document WO2010088947, FIG. 15. By adjusting the arc evaporators for coating deposition the internal (centric) permanent magnet was positioned back away (rear) in relation to the target and the outside permanent magnets were positioned at a distance of 8 mm in relation to the target. The arc evaporators were operated setting a coil current of −0.3 A and an arc current of 140 A. Coated cutting tools were post-treated after coating using different mechanical methods in order to improve surface quality.

The post-treated solid carbide drills coated according to example 1 were tested by cutting tests 1 and 3 and exhibit an impressively superior cutting performance in all cutting tests (see FIGS. 2 and 4), almost 50% increased operating time. Results in cutting tests were not essentially modified by the art of the post treatment.

FIG. 2 shows the results obtained by cutting test 1, which was carried out with coated solid carbide drills Ø 8.5 mm by the following cutting parameters:
Cutting speed $v_c$: 180 m/min
Feed f: 0.252 mm/rev
Through holes, ap: 40 mm
Workpiece material: 1.7225 (42CrMo4) at Rm=900 MPa FIG. 4 shows the results obtained by cutting test 3, which was carried out with coated solid carbide drills Ø 8.5 mm by the following cutting parameters:
Cutting speed $v_c$: 100 m/min
Feed f: 0.22 mm/rev
Through holes, ap: 40 mm
Workpiece material: EN-GJS-600-3 (nodular cast iron)

Example 2 of Coating Deposition According to the Present Invention:

AlTiN/TiSiN coatings having a bilayer period of about 8-15 nm were deposited on high performance solid carbide drills Ø 8.5 mm at a coating machine of the company Oerlikon Balzers of the type Innova by following coating conditions:
$N_2$-Pressure: 5 Pa
Substrate bias-voltage: −30 V (DC)
Temperature: 570° C.

Targets having an element composition of $Al_{0.6}Ti_{0.4}$ and $Ti_{0.75}Si_{0.25}$ were used respectively for the deposition of the AlTiN and TiSiN nano-layer. The material source targets were evaporated using arc evaporators of the same type as those described in example 1. For the adjustment of the magnet system the internal permanent magnet was also positioned rear in relation to the targets, while the outside permanent magnets were positioned respectively at a distance of 8 mm and 10 mm from the TiAl- and TiSi-targets. The arc evaporators for the evaporation of the TiAl- and TiSi-targets were operated respectively setting coil currents of −0.3 A and −0.5 A and arc currents of 140 A and 160 A.

Example 3 of Coating Deposition According to the Present Invention:

AlTiN/TiSiN coatings having a bilayer period of about 5-30 nm were deposited on high performance solid carbide drills Ø 8.5 mm at a coating machine of the company Oerlikon Balzers of the type Innova by following coating conditions:
$N_2$-Pressure: 6 Pa
Substrate bias-voltage: −50 V (DC)
Temperature: 500° C.

Targets having an element composition of $Al_{0.6}Ti_{0.4}$ and $Ti_{0.80}Si_{0.20}$ were used respectively for the deposition of the AlTiN and TiSiN nano-layer. The material source targets were evaporated using arc evaporators of the same type used in examples 1 and 2. The arc evaporators were operated by same parameters than those used in example 1.

The coatings deposited according to the examples 2 and 3 showed also very good cutting performance in similar cutting tests as those described in cutting test 1 and 3.

Example 4 of Coating Deposition According to the Present Invention:

AlTiN/TiSiN coatings according to the present invention having a bilayer period of about 5-30 nm were deposited on high performance solid carbide drills Ø 8.5 mm. For the evaporation of the TiAl- and TiSi-targets were used arc evaporators of the type described in the U.S. patent document with Ser. No. 61/357,272. This type of arc evaporators comprise a cathode (target), an anode and a magnetic means, which allow to lead the streamlines of the magnetic field to the anode, which is arranged in the direct neighborhood of the cathode. The arc evaporators were operated for the evaporation of the TiAl- and TiSi-targets setting respectively coil currents of 1.0 A and 1.2 A and arc currents of 200 A and 180 A.

The solid carbide drills coated according to example 4 were also post-treated and their cutting performance was evaluated by cutting test 2. The results of cutting test 2 are shown in FIG. 3.

FIG. 3 shows the results obtained by cutting test 2, which was carried out with coated solid carbide drills Ø 8.5 mm by the following parameters:
Cutting speed $v_c$: 80 m/min
Feed f: 0.284 mm/rev
Through holes, ap: 40 mm
Workpiece material: 1.7225 (42CrMo4) at Rm=900 MPa Example 5 of coating deposition according to the present invention:

AlTiN/TiSiN coatings according to the present invention having a bilayer period of about 30, 50, 75, 100, 150, 180, 200, 250 and 300 nm were deposited in different batches on high performance solid carbide drills Ø 8.5 mm using arc evaporators of the same type than those used in example 4. Arc currents in range of 160-200 A and 180-200 A were respectively set for the material evaporation from the TiSi- and AlTi-targets. Coil current were also correspondingly adjusted.

In general coatings having nano-bilayer periods of about 300 nm exhibited a marked inferior cutting performance, while coatings having nano-bilayer periods lower than 100 nm exhibited particularly best cutting performance. Results by cutting tests of high performance solid carbide drills Ø 8.5 mm coated according to example 4 were comparable good to those obtained by cutting tests of the solid carbide drills coated according to examples 1-3.

Using the above mentioned arc-evaporators it was possible to deposit coatings according to the present invention which exhibit coatings hardness values of about 36-46 GPa and Young's modulus values of about 400-470 GPa. Both coating hardness and Young's modulus values were measured using nanoindentation techniques.

Furthermore the coatings deposited according to the present invention exhibit a texture intensity 200/100≥10 determined by X-ray examinations.

Figure 8:
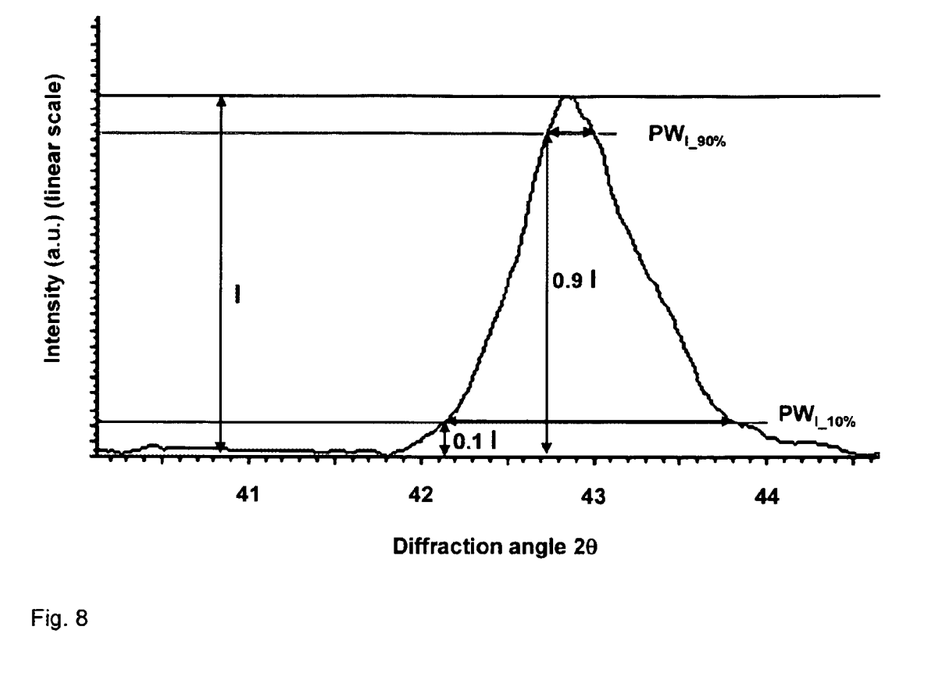
FIG. 8: Schematic drawing showing the definition of the factor $F_{10/90}$ for the inventive coating 1.

The ratio of the peak width $PW_{I\_10/90}$ was calculated using the formula: $PW_{I\_10\%}/PW_{I\_90\%}$, where $PW_{I\_10\%}$ and $PW_{I\_90\%}$ are the meaningful width of the peak 200 at 10% and 90% of the maximum peak intensity, respectively. The peak 200 is measured at approximately 43° in the 2θ axis using X-ray diffraction with CuKα radiation. The diffraction line was corrected regarding contribution from CuKα$_2$ radiation, diffraction statistics (smoothening) and background. The so obtained peak 200 measured in the nanolaminated structure of alternating A and B layers which is comprised in the inventive coating 1 is exemplary shown in FIG. 8.

Characteristic $PW_{I\_10/90}$ values of the nanolaminated coating structures of alternating A and B layers $(Al_xTi_{1-x-y}W_y)N/(Ti_{1-z-u}Si_zW_u)N$ deposited according to the present invention are reported in table 1:

TABLE 1

$PW_{I\_10/90}$ measured for nanolaminated coating structures $(Al_xTi_{1-x-y}W_y)N/Ti_{1-z-u}Si_zW_u)N$ deposited according to the present invention which are comprised in the inventive coatings 1, 2, 3 and 4.

| Inventive coating | $PW_{I\_10/90}$ |
|---|---|
| 1 | 6.5 |
| 2 | 6.2 |
| 3 | 7.1 |
| 4 | 6.8 |

In a further preferred embodiment of the present invention the nanolaminated $(Al_xTi_{1-x-y}W_y)N/(Ti_{1-z-u}Si_zW_u)N$ features a ratio of the peak width $PW_{I\_10/90}$ measured at the 200 peak at approximately 43° in the 2θ axis, using X-ray diffraction with CuKα radiation, in accordance with the method described above, of less than 7.5, preferably less than 7.

The present invention discloses a coated body, preferably a coated tool comprising a body (1), onto which is deposited a hard and wear resistant PVD coating characterized in that the coating comprises a nanolaminated structure (5) of alternating A and B layers A1, A2, A3, . . . An and B1, B2, B3, . . . Bm, respectively, where layer A is $(Al_xTi_{1-x-y}W_y)N$, with $0.50 \leq x \leq 0.65$ and $0 \leq y \leq 0.10$, where the coefficients given by x, 1-x-y and y correspond to the atomic concentration of aluminum, titanium and tungsten, respectively, considering only the elements aluminum, titanium and tungsten for the element quantification in the layer A, and where layer B is $(Ti_{1-z-u}Si_zW_u)N$, with $0.05 \leq z \leq 0.30$ and $0 \leq u \leq 0.10$, where the coefficients given by 1-z-u, z and u correspond to the atomic concentration of titanium, silicon and tungsten, respectively, considering only the elements titanium, silicon and tungsten for the element quantification in said layer B, with a thickness of the nanolaminated structure between 0.01 and 30 μm, preferably between 1 and 15 μm, an average individual thickness of the A and B layers is between 1 and 200 nm, respectively, preferably between 1 and 50 nm, more preferably between 1 and 30 nm, characterized in that the nanolaminated structure of alternating A and B layers exhibits a fine-grained structure.

More preferably the coated body is a cutting tool comprising a body (1) of a hard alloy of cemented carbide, cermet, ceramics, cubic boron nitride based material or high speed steel.

Preferably, the thickness of the A layers (A1, A2, A3, . . . An), referred to as dA1, dA2, dA3 . . . dAn, is equal or smaller than the thickness of the B layers (B1, B2, B3, . . . Bm), referred to as dB1, dB2, dB3 . . . dBm, comprised in the nanolaminated structure of alternating A and B layers, preferably the thickness of the A layers is equal or smaller than ¾ of the thickness of the B layers: $dA1 \leq ¾ dB1$, $dA2 \leq ¾ dB2$, $dA3 \leq ¾ dB3$, $dAn \leq ¾ dBm$, Preferably in at least a portion of the total thickness of the nanolaminated structure:

the thickness of the A layers and/or the thickness of the B layers remains constant, so that $dA1=dA2=dA3 \ldots =dAn$ and/or $dB1=dB2=dB3 \ldots =dBm$, and/or the thickness of A layers and/or the thickness of the B layers increases, so that $dA1 \geq dA2 \geq dA3 \ldots \geq dAn$ and/or $dB1 \geq dB2 \geq dB3 \ldots \geq dBm$, and/or the thickness of the A layers and/or the thickness of the B layers decreases, so that $dA1 \leq dA2 \leq dA3 \ldots \leq dAn$ and/or $dB1 \leq dB2 \leq dB3 \ldots \leq dBm$ Preferably, in the nanolaminated coating structure comprised in the coating of a coated body as mentioned above:

the sum of the thicknesses of a nano-layer of type A and a nano-layer of type B deposited alternately one on each other forming a nano-bilayer period is less than 300 nm, preferably less than 100 nm, more preferably between 5 and 50 nm, and said nanolaminated coating structure comprises at least a total of four individual nano-layers A and B deposited alternately one on each other forming a A1/B1/A2/B2/ or B1/A1/B2/A2 multilayer architecture, preferably at least a total of ten individual nano-layers forming a A1/B1/A2/B2/A3/B3/A4/B4/A5/B5 or B1/A1/B2/A2/B3/A3/B4/A4/B5/A5 multilayer architecture.

Preferably, in the nanolaminated coating structure comprised in the coating of a coated body as mentioned above:

the nanolaminated structure features a fine-grained structure comprising grains whose largest size is ⅓ of the overall thickness of the nanolaminated coating structure.

Preferably, in the nanolaminated coating structure comprised in the coating of a coated body as mentioned above:

the nanolaminated structure features a fine-grained structure comprising grains having an average size of maximal 1000 nm, preferably between 10 and 800 nm, more preferably between 10 and 400 nm.

According to the present invention, the nanolaminated coating structure comprised in the coating of the coated body mentioned before can be or can comprise an equiaxed structure in which the grains have approximately the same dimensions in all directions According to the present invention, the nanolaminated coating structure comprised in the coating of the coated body mentioned before can have an average residual stress, σ, which is between 2.5 and 5 GPa, preferably between 3 and 4 GPa.

According to the present invention, the nanolaminated coating structure comprised in the coating of the coated body mentioned before can have a ratio of the peak width, $PW_{I\_10/90}$, which is less than 7.5, preferably less than 7, where:

$PW_{I\_10/90}°=°PW_{I\_10\%}/PW_{I\_90\%}$, $PW_{I\_10\%}$ and $PW_{I\_90\%}$ are the meaning full width of the peak 200 at 10% and 90% of the maximum peak intensity, respectively, and the 200 peak is measured using X-ray diffraction with CuKα radiation at approximately 43° in the 2θ axis. The diffraction line was corrected regarding contribution from CuKα$_2$ radiation, diffraction statistics (smoothening) and background.

In a preferred embodiment of a coating according to the present invention, the coating comprises:

at least one interlayer (2) deposited between the substrate (1) and said nanolaminated coating film (5), and/or at least one top-layer (3) deposited on the outermost nano-layer of the nanolaminated coating film (5).

Preferably, the coated body according to the present invention is a drilling or a milling tool.

Preferably, the coated body according to the present invention is used for drilling or milling operations, more preferably for drilling of steel, stainless steel, or cast iron or milling of hardened steel or stainless steel.

A preferred method for manufacturing a coated body according to the present invention is an arc PVD method characterized by the use of at least one arc vaporization source for the deposition of the nano-layered coating film on the substrate surface, wherein the at least one arc vaporization source comprises a magnetic field arrangement provided on a target for generating magnetic fields on and above the target surface, wherein the magnetic field arrangement comprises marginal permanent magnets and at least one ring coil placed behind the target, whose inner diameter defined by the windings is smaller than or equal to, and in any case not considerably larger than the diameter of the target, and the marginal permanent magnets can be displaced away from the target essentially perpendicularly to the surface of the target and the projection of the marginal permanent magnets onto the target surface is further away from the middle of the target surface by comparison to the projection of the ring coil onto the target surface, the inner or internal, centric permanent magnet is positioned back away rear in relation to the target and the outer or outside permanent magnet is positioned at a distance of several millimeters in relation to the target, preferably between 6 and 10 mm, more preferably ca. 8 mm. Preferably by using this method for the deposition of the nanolaminated coating structure according to the present invention a negative coil current is applied, the applied coil current is preferably between −0.1 and −1 A.

A further preferred method for manufacturing a coated body according to the present invention is an arc PVD method characterized by the use of at least one arc vaporization source for the deposition of the nano-layered coating film on the substrate surface, wherein the at least one arc vaporization source comprises a target used as a cathode, an anode arranged in the direct neighborhood of the cathode, and magnetic means which allow to lead the streamlines of the magnetic field to the anode. Preferably by using this method for the deposition of the nanolaminated coating structure according to the present invention a positive coil current is applied, the applied coil current is preferably between 0.5 and 2 A.

Preferably, the method applied for the deposition of nanolaminated coating structures according to the present invention comprises the use as source coating material of:

at least one composite target made by means of powder-metallurgical techniques, comprising aluminum and titanium and/or tungsten are used for the deposition of the nano-layer of type A, and/or at least one composite target made by means of melt-metallurgical techniques, comprising titanium and silicon and/or tungsten are used for the deposition of the nano-layer of type B.

What is claimed is:

1. Method for manufacturing a coated body within which a coating comprising a nanolaminated structure 5 of alternating A nano-layers consisting of at least 90 at.-% AlTiN and B nano-layers consisting of at least 90 at.-% TiSiN is deposited on the substrate surface, wherein at least two arc vaporization sources are used for the deposition of the nanolaminated structure, characterized in that each one of the at least one arc evaporation source comprises a magnetic field arrangement provided on a target for generating magnetic fields on and above the target surface, wherein the magnetic field arrangement comprises marginal permanent magnets, a centric permanent magnet and at least one ring coil placed behind the target, whose inner diameter defined by the windings is smaller than or equal to, and in any case not considerably larger than the diameter of the target, and during the deposition of the nanolaminated structure the marginal permanent magnets are positioned away from the target, at a distance of several millimeters in relation to the target, in such a manner that the projection of the marginal permanent magnets onto the target surface is further away from the middle of the target surface by comparison to the projection of the ring coil onto the target surface, and the centric permanent magnet is positioned back away rear in relation to the target, and the target of one of the at least two arc evaporator sources comprises AlTi and the target of the another arc evaporator source comprises TiSi, and the coating parameters and the distance between the permanent magnets and the target in each one of the at least two evaporation sources, are adjusted in such a manner that the nanolaminated film is deposited having a fine-grained microstructure which can be observed in SEM micrographs of fractured cross sections of the coating.

2. Method according to claim 1 characterized in that the distance between the permanent magnets and the target is between 6 and 10 mm.

3. Method according to claim 2 characterized in that the distance between the permanent magnets and the target is about 8 mm.

4. Method according to claim 1 characterized in that a negative coil current is applied.

5. Method according to claim 4 characterized in that the applied coil current is between −0.1 and −1 A.

6. Method according to claim 1 characterized in that at least two arc evaporation sources, each arc evaporation source comprising a target which is used as source material for the deposition of the nanolaminated structure, wherein the target comprised in one of the at least two arc evaporation sources is a composite target comprising at least as main components in atomic percentage aluminum and titanium, which is used for the deposition of the nano-layer of type A, and the target comprised in the another one of the at least two arc evaporation sources is a composite target comprising at least as main components in atomic percentage titanium and silicon, which is used for the deposition of the nano-layer of type B.

7. Method according to claim 6 characterized in that at least one of the two used composite targets is made by means of powder metallurgical techniques.

8. Method according to claim 1 characterized in that the nanolaminated structure is deposited in a reactive atmosphere comprising nitrogen as main component.

9. Method according to claim 1 characterized in that the nanolaminated structure is deposited in a coating chamber having a reactive atmosphere comprising at least as main component nitrogen.

10. Method according to claim 9 characterized in that the nitrogen partial pressure is between 4 and 7 Pa.

11. Method according to claim 1 characterized in that during the deposition of the nanolaminated structure a negative DC bias voltage is applied, preferably a bias voltage between −20 and −60 V.

12. Method according to claim 1 characterized in that a during the deposition of the nanolaminated structure the substrate is maintained at a temperature not lower than 450° C. and not higher than 700° C.

13. Method for manufacturing a coated body within which a coating comprising a nanolaminated structure 5 of alternating A nano-layers consisting of at least 90 at.-% AlTiN and B nano-layers consisting of at least 90 at.-% TiSiN is deposited on the substrate surface, wherein at least two arc vaporization sources are used for the deposition of the nanolaminated structure, characterized in that the target of one of the at least two arc evaporator sources comprises AlTi and the target of the another arc evaporator source comprises TiSi, and each one of the at least two arc evaporation sources comprises a target used as a cathode, an anode arranged in the direct neighborhood of the cathode, and magnetic means for producing a magnetic field, whose streamlines are led to the anode, wherein the arc evaporators are operated by setting respectively coil currents and arc currents, and the coating parameters and the coil current in each one of the at least two evaporation sources, are adjusted in such a manner that the nanolaminated film is deposited having a fine-grained microstructure which can be observed in SEM micrographs of fractured cross sections of the coating.

14. Method according to claim 13 characterized in that a positive coil current is applied.

15. Method according to claim 14 characterized in that the applied coil current is between 0.5 and 2 A.

16. Body at least partially coated by using a method according claim 1 or claim 13 characterized in that the deposited A nano-layers have an element composition given by the formula $(Al_xTi_{1-x-y}W_y)N$, with $0.50 \leq x \leq 0.65$ and $0 \leq y \leq 0.10$, where the coefficients given by x, 1-x-y and y correspond to the atomic concentration of aluminum, titanium and tungsten, respectively, considering only the elements aluminum, titanium and tungsten for the element quantification in said nano-layer A, and the deposited B nano-layers have an element composition given by the formula $(Ti_{1-z-u}Si_zW_u)N$, with $0.05 \leq z \leq 0.30$ and $0 \leq u \leq 0.10$, where the coefficients given by 1-z-u, z and u correspond to the atomic concentration of titanium, silicon and tungsten, respectively, considering only the elements titanium, silicon and tungsten for the element quantification in said nano-layer B.

* * * * *

UNITED STATES PATENT AND TRADEMARK OFFICE
CERTIFICATE OF CORRECTION

PATENT NO. : 9,200,371 B2  
APPLICATION NO. : 14/130076  
DATED : December 1, 2015  
INVENTOR(S) : Mirjam Arndt Page 1 of 1

It is certified that error appears in the above-identified patent and that said Letters Patent is hereby corrected as shown below:

In the specification,

Column 3, line 30, please replace "stress a in" with -- stress σ in --

Column 3, line 33, please replace "stresses a of" with -- stresses σ of --

Column 4, line 21, please replace "dA" with -- $dA_1$ --

Column 4, line 48, please replace "dA dB" with -- $dA \leq dB$ --

Column 5, line 21, please replace "-20-60 V" with -- -20 - -60V --

Column 6, line 58, please replace "stress, a," with -- stress, σ, --

Signed and Sealed this  
Twenty-second Day of March, 2016

Michelle K. Lee  
*Director of the United States Patent and Trademark Office*